(12) United States Patent
Yasuda et al.

(10) Patent No.: US 6,782,901 B2
(45) Date of Patent: Aug. 31, 2004

(54) SULFURIC ACID RECYCLE APPARATUS

(75) Inventors: Okimitsu Yasuda, Mie-ken (JP); Seiichi Fujii, Yokohama (JP)

(73) Assignee: Suntec System Co., Ltd., Tokyo (JP)

( * ) Notice: Subject to any disclaimer, the term of this patent is extended or adjusted under 35 U.S.C. 154(b) by 316 days.

(21) Appl. No.: 10/045,327

(22) Filed: Nov. 7, 2001

(65) Prior Publication Data

US 2002/0108643 A1 Aug. 15, 2002

(30) Foreign Application Priority Data

Nov. 21, 2000 (JP) ........................................ 2000-354784

(51) Int. Cl.[7] .............................................. B08B 3/00
(52) U.S. Cl. ...................... 134/107; 134/111; 134/182; 134/902
(58) Field of Search ............................. 134/100.1, 107, 134/111, 182, 902

(56) References Cited

U.S. PATENT DOCUMENTS 4,778,532 A * 10/1988 McConnell et al. ........... 134/10
4,917,123 A * 4/1990 McConnell et al. ......... 134/95.2
5,963,878 A * 10/1999 Brereton et al. ............. 568/927
6,055,995 A * 5/2000 Miyazawa ................... 134/109

FOREIGN PATENT DOCUMENTS

JP 03147323 A * 6/1991

* cited by examiner

Primary Examiner—Frankie L. Stinson
Assistant Examiner—Joseph Perrin
(74) Attorney, Agent, or Firm—Flynn, Thiel, Boutell & Tanis, P.C.

(57) ABSTRACT

A sulfuric acid recycle apparatus capable of concentrating sulfuric acid, which is lowered in concentration upon completion of a wafer cleaning process, to a level to be recycled is provided. The sulfuric acid recycle apparatus for recycling sulfuric acid in a wafer cleaning fluid prepared by mixing sulfuric acid and hydrogen peroxide solution comprises a reaction bath having two openings formed of at least an introduction port and a discharge port for obtaining concentrated sulfuric acid by concentrating sulfuric acid in the wafer cleaning waste fluid introduced from the introduction port upon completion of a wafer cleaning process, then discharging the concentrated sulfuric acid from the discharge port, a wafer processing bath for processing wafers, and a supply unit for supplying the concentrated sulfuric acid to the wafer processing bath.

8 Claims, 6 Drawing Sheets

SULFURIC ACID RECYCLE APPARATUS

BACKGROUND OF THE INVENTION

1. Field of the Invention

The invention relates to a sulfuric acid recycle apparatus, which can be suitably applied, e.g., to a recycle apparatus for recycling sulfuric acid which is used for a wafer process in a semiconductor fabricating process.

2. Related Art

A large quantity of wafer cleaning fluid prepared by mixing sulfuric acid with hydrogen peroxide solution has been conventionally used in a semiconductor fabricating process for exfoliating resist applied to a wafer and for removing an organic matter stuck to the surface of the wafer. Upon completion of a wafer cleaning process, the wafer cleaning fluid becomes wasted fluid (hereinafter referred to as a wafer cleaning waste fluid), and the wafer cleaning waste fluid is lowered in concentration owing to water which is produced by decomposition of hydrogen peroxide solution, and hence it is difficult to be recycled. Further, since a wasting cost and a collecting cost of the wafer cleaning waste fluid are cheap, wafer cleaning waste fluid is wasted as it is.

However, considering the occurrence of today's environmental problem which is caused by using a large quantity of such a wafer cleaning fluid and by repetitively wasting such a wafer cleaning waste fluid, a wasting process of the wafer cleaning waste fluid is not preferable in view of countermeasures against environmental protection even if a wasting cost thereof is cheap.

Further, since sulfuric acid per se is a powerful chemical of strong acidity, it cannot be wasted as it is, but need be wasted after a neutralization process and cohesion and precipitation processes are applied thereto. Under such circumstances, there is a problem that a large quantity of chemicals are required for effecting waste process of sulfuric acid.

Accordingly, it is a very important problem to reduce an amount of wasted sulfuric acid in view of countermeasures against environmental protection, and there has been desired development of techniques for concentrating sulfuric acid which is lowered in concentration upon completion of a wafer cleaning process to prepare sulfuric acid so as to be recycled for the same purpose.

SUMMARY OF THE INVENTION

It is an object of the invention to provide a sulfuric acid recycle apparatus capable of concentrating sulfuric acid, which is lowered in concentration upon completion of a wafer cleaning process, to a level to be recycled.

It is a first aspect of the invention to provide a sulfuric acid recycle apparatus for recycling sulfuric acid in a wafer cleaning fluid prepared by mixing sulfuric acid with hydrogen peroxide solution wherein the apparatus comprises a reaction bath having two openings formed of at least an introduction port and a discharge port for obtaining concentrated sulfuric acid by concentrating sulfuric acid in a wafer cleaning waste fluid introduced from the introduction port upon completion of a wafer cleaning process, then discharging the concentrated sulfuric acid from the discharge port, and a wafer processing bath for processing wafers, and a supply unit for supplying the concentrated sulfuric acid to the wafer processing bath.

That is, the sulfuric acid recycle apparatus of the invention removes residual hydrogen peroxide solution from the wafer cleaning waste fluid, or water and the like which are produced by decomposition of hydrogen peroxide solution, thereby concentrating sulfuric acid, and returning the concentrated sulfuric acid again to the wafer processing bath so as to recycle sulfuric acid in the wafer cleaning process.

The reaction bath of the invention may have a construction capable of storing the wafer cleaning waste fluid temporarily therein at the time of concentration process, and having corrosion resistance against sulfuric acid and hydrogen peroxide solution under concentration conditions. The reaction bath may be made of e.g., quarts glass.

For the supply unit for supplying concentrated sulfuric acid to the wafer processing bath, e.g., a pump serving as a unit for supplying a fluid owing to the difference in pressure may be used. In this case, although the concentrated sulfuric acid can be directly supplied from the reaction bath to the wafer processing bath, it is preferable to provide a cooling bath between the reaction bath and the wafer processing bath considering a case where the sulfuric acid is heated when it is concentrated, or a case where the concentrated sulfuric acid has a high temperature. For the pump of this type, a rotary pump, a diaphragm pump, and various other pumps may be used.

According to the invention, the sulfuric acid recycle apparatus includes the reaction bath for concentrating the sulfuric acid in the wafer cleaning waste fluid and the supply unit for supplying the thus obtained concentrated sulfuric acid to the wafer processing bath. Accordingly, water in the wafer cleaning waste fluid and hydrogen peroxide solution can be concentrated and removed, and the thus obtained concentrated sulfuric acid can be supplied to the wafer processing bath to be recycled again for use in a wafer cleaning process. Further, it is possible to continuously effect a series of processes comprising a wafer cleaning process, a concentration process of sulfuric acid in the wafer cleaning waste fluid and a recycling step of concentrated sulfuric acid, which is very efficient. As a result, a cost involving in wafer cleaning process can be reduced.

With the sulfuric acid recycle apparatus having the foregoing construction, heating units for heating the wafer cleaning waste fluid is provided in the reaction bath and a gas discharge port 14 for discharging a gas produced from the wafer cleaning waste fluid when it is heated by the heating unit, wherein a suction unit for sucking the gas is connected to the gas discharge port.

That is, although vapor is produced from water in the wafer cleaning waste fluid or the hydrogen peroxide solution when sulfuric acid is heated or concentrated, such a gas is not released to the outside owing to a natural diffusion but it is positively sucked and removed from the gas discharge port 14 formed in the reaction bath, thereby quickly concentrating sulfuric acid.

For the heating unit, it may be formed of any type if it can heat the wafer cleaning waste fluid in the reaction bath, and a heating method and the like is not limited to a particular one. That is, it may be a unit capable of heating the reaction bath from the outside or a unit capable of heating the reaction bath from the inside thereof. Particularly, if the heating unit is a type capable of directly heating the wafer cleaning waste fluid, the wafer cleaning waste fluid can be heated efficiently and concentration of sulfuric acid can be effected quickly. For such heating units, a unit having a heater made of, e.g., a tantalum and tungsten which is covered with quarts glass at the periphery thereof may be employed.

Further, for the suction unit, an aspirator and the like serving as a unit for sucking a gas utilizing decompression may be employed. If such an aspirator is employed, the reaction bath can be decompressed, thereby lowering a boiling point of water and that of hydrogen peroxide solution so as to accelerate the removal of water and hydrogen peroxide solution.

It is preferable to provide in the reaction bath a plurality of partition plates for changing an advancing direction of wafer cleaning waste fluid, and an inclination plate disposed at the portion closer to the gas discharge port rather than the partition plates for allowing concentrated sulfuric acid to flow along the surface thereof.

It is preferable to allow the wafer cleaning waste fluid to flow toward the gas discharge port provided in the reaction bath while the wafer cleaning fluid is vertically circulated by convection when a plurality of partition plates are disposed in the reaction bath. That is, when three pieces of partition plates are used, a first partition plate positioned at the introduction port side of the reaction bath is disposed to be remote from the bottom surface of the reaction bath, and a second partition plate positioned adjacent to the first partition plate is disposed to contact the bottom surface of the reaction bath, while the upper surface of the second partition plate is positioned lower than that of the first partition plate, and a third partition plate positioned at the gas discharge port side is disposed to be remote from the bottom surface of the reaction bath in the same manner as the first partition plate.

With the disposition of the partition plates as set forth above, the wafer cleaning waste fluid introduced from the introduction port moves from a gap defined between the lower surface of the first partition plate and the bottom surface of the reaction bath to the second partition plate, and thus moved wafer cleaning waste fluid moves to the third partition plate when it is filled up at the height exceeding the upper surface of the second partition plate, and it stays between the second partition plate and the inclination plate. Further, when concentrated sulfuric acid between the third partition plate and the inclination plate stays therebetween at the height exceeding the upper surface thereof, it flows along the surface of the inclination plate and moves to the gas discharge port. Accordingly, the wafer cleaning waste fluid can be steadily heated so that it can be sufficiently concentrated.

Further, since the inclination plate is provided in the reaction bath so as to allow concentrated sulfuric acid to flow along the surface thereof and drop in the reaction bath, a surface area of concentrated sulfuric acid becomes large when it is supplied to the gas discharge port, while removal of water and the like which slightly remain on the surface of the inclination plate 16 is further accelerated, thereby improving a quality of concentrated sulfuric acid. It is preferable that the inclination plate has irregularities thereon so as to enhance concentration of concentrated sulfuric acid and improve a quality thereof. When the irregularities are formed on the surface of the inclination plate, a surface area of the inclination plate becomes larger, thereby efficiently removing water and the like. For a material of the partition plates and the inclination plate, a material having corrosion resistance against strong sulfuric acid at high temperature can be used, e. g., quarts glass used in the reaction bath can be also employed.

Further, it is preferable that the reaction bath has a waterdrop storage bath capable of preventing waterdrop stuck to a ceiling surface of the reaction bath from being mixed with concentrated sulfuric acid. It is preferable that the waterdrop storage bath is disposed over the gas discharge port so as to prevent water from being mixed with finally processed concentrated sulfuric acid. Further, it is ideal that the waterdrop storage bath is disposed to cover the lower portion of the gas discharge port if the gas discharge port has been already formed in the reaction bath. With the provision of the waterdrop storage bath, it is possible to prevent the concentration of concentrated sulfuric acid from lowering, which is caused by the mixture of water, which is once removed from the wafer cleaning waste fluid, with concentrated sulfuric acid.

It is preferable to supply fresh sulfuric acid to concentrated sulfuric acid which is obtained by heating and concentrating wafer cleaning waste fluid when sulfuric acid of concentrated sulfuric acid is reduced. For means for supplying fresh sulfuric acid, it is possible to employ means for pumping up fresh sulfuric acid from a sulfuric acid tank, which is installed separately in the sulfuric acid recycle apparatus, by a pump like the supply unit, thereby supplying fresh sulfuric acid to the concentrated sulfuric acid. With the provision of the supply means or a supply unit capable of supplying fresh sulfuric acid, if concentration of concentrated sulfuric acid obtained from the wafer cleaning waste fluid is lower than a desired value, concentration thereof can be made higher. Even with the employment of such a supply unit, the amount of use of fresh sulfuric acid can be remarkably reduced compared with a case where all the wafer cleaning waste fluid are wasted.

It is preferable that the reaction bath 10 has a heating temperature therein ranging from 150° C. to 315° C., more preferably 180° C. to 250° C. If the heating temperature exceeds 315° C., there occurs drawbacks that parts used for the reaction bath 10 are limited to a high fire-resistive material, having a high fire resistance, and also since the amount of vapor produced in the reaction bath 10 increases, the sulfuric acid recycle apparatus becomes large-sized and complex. On the other hand, if the heating temperature is less than 150° C., efficiency of concentration of sulfuric acid (dehydration efficiency) becomes worse so that an expected effect can not be achieved.

BRIEF DESCRIPTION OF THE DRAWINGS

FIGS. 6(A), 6(B) are views showing a casing according to the second embodiment of the invention shown in FIG. 4 wherein FIG. 6(A) is a front view and FIG. 6(B) is a side view.

PREFERRED EMBODIMENT OF THE INVENTION

First Embodiment

A sulfuric acid recycle apparatus according to a first embodiment of the invention is described hereinafter with reference to FIGS. 1 to 3.

Figure 1:
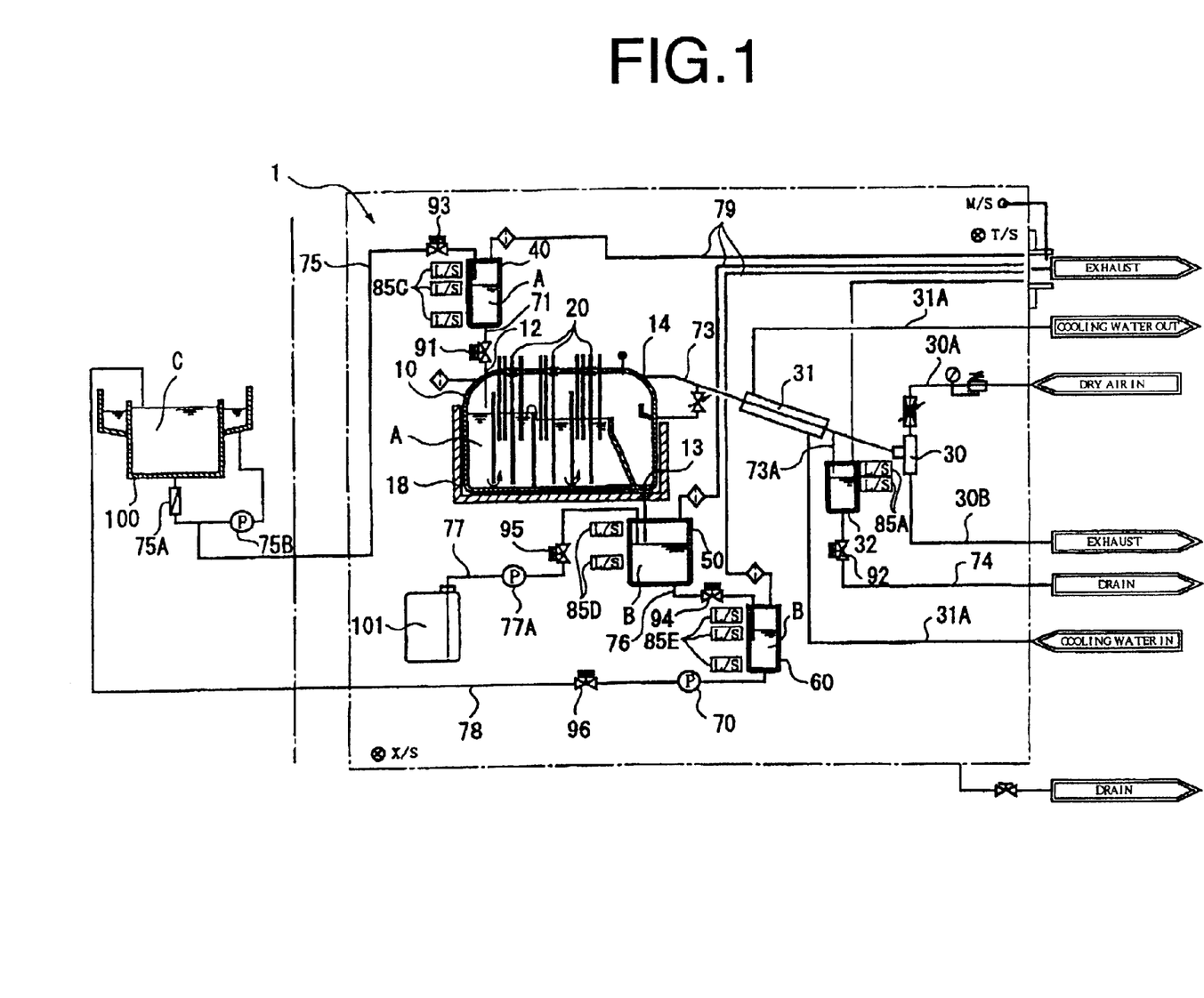
FIG. 1 is a schematic view showing the construction of a sulfuric acid recycle apparatus according to a first embodiment of the invention.
Figure 2:
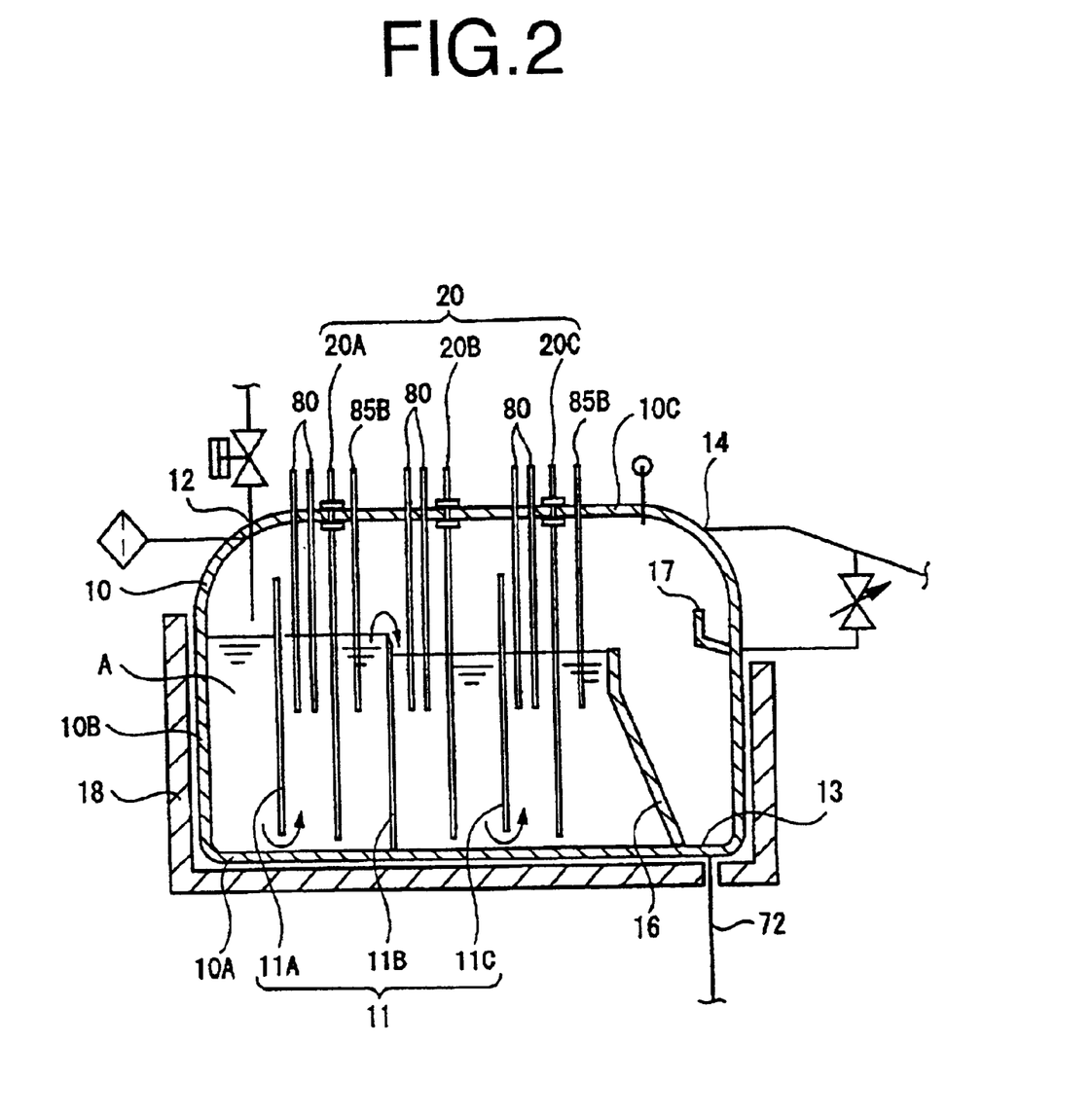
FIG. 2 is a sectional view showing a reaction bath according to the first embodiment of the invention in FIG. 1.
Figure 3:
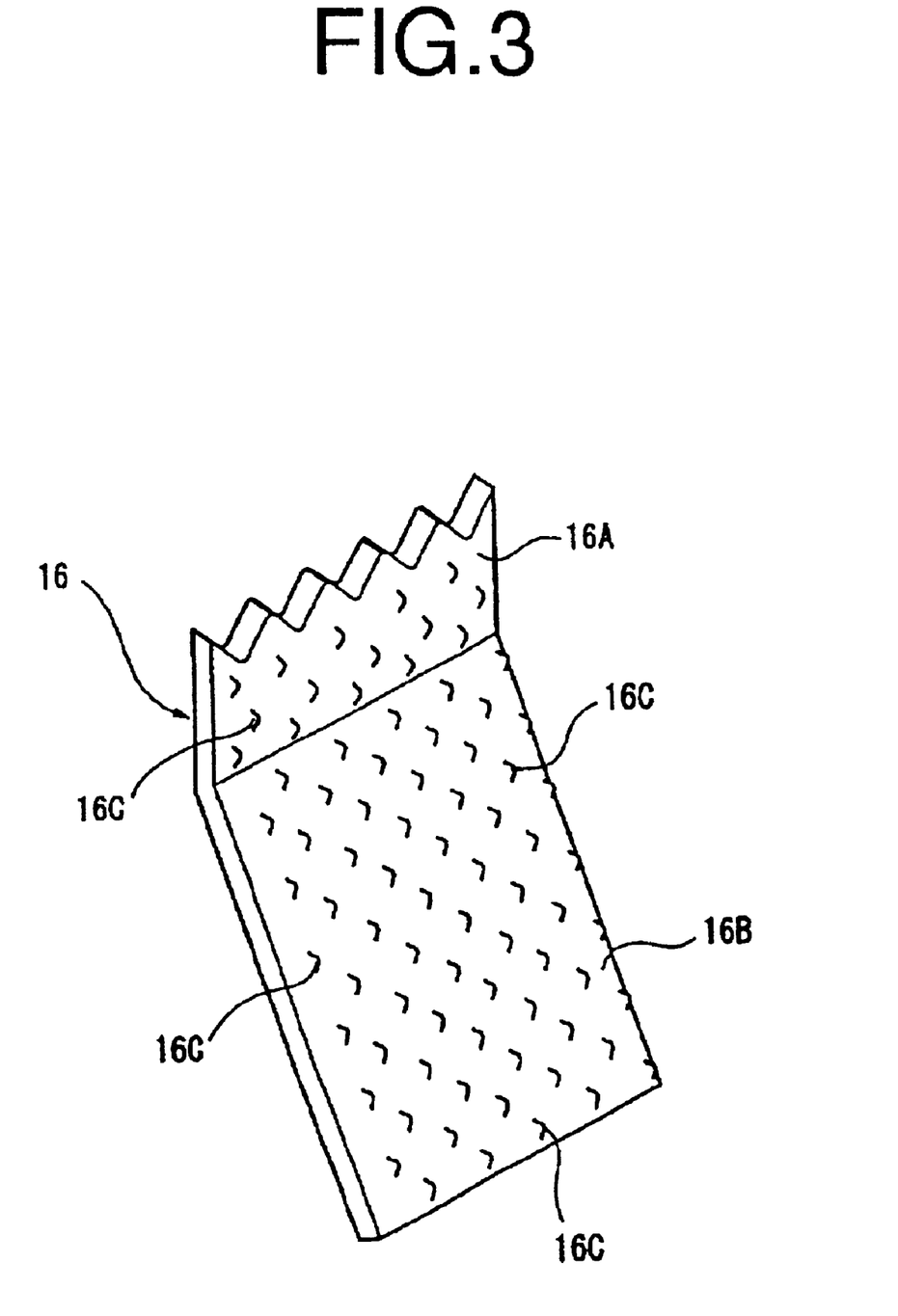
FIG. 3 is a perspective view showing an inclination plate according to the first embodiment of the invention in FIG. 1.

FIGS. 1 and 2 are schematic views showing the construction of a sulfuric acid recycle apparatus 1 according to the first embodiment of the invention. The sulfuric acid recycle apparatus 1 comprises a reaction bath 10, first to third heaters 20A, 20B, 20C serving as heating units and attached to the reaction bath 10, an aspirator 30 serving as a suction unit, a raw material bath 40, a concentration adjustment bath 50, a cooling bath 60 and a pump 70 serving as a supply unit as its main components.

The reaction bath 10 is made of quarts glass and includes three openings, namely, an introduction port 12 at the left upper surface of the reaction bath 10 in FIG. 1 for introducing a wafer cleaning waste fluid A, a discharge port 13 at the right lower surface of the reaction bath 10 in FIG. 1 for exhausting concentrated sulfuric acid B, and a gas discharge port 14 at the right upper surface of the reaction bath 10 in FIG. 1 for discharging a gas such as vapor produced by heating. The reaction bath 10 is covered with a keep-warm member 18 which is disposed outside the reaction bath 10 at a bottom surface 10A and a side surface 10B. A waste fluid injection pipe 71 made of a fluorocarbon resin and having a first valve 91 is attached to the introduction port 12, and the introduction port 12 is connected to the raw material bath 40 for storing the wafer cleaning waste fluid A therein via the waste fluid injection pipe 71. A concentrated sulfuric acid discharge pipe 72 made of a fluorocarbon resin for supplying the concentrated sulfuric acid B to the concentration adjustment bath 50 is attached to the discharge port 13 (see FIG. 2).

A discharge pipe 73 is attached to the gas discharge port 14 and the reaction bath 10 is connected to the aspirator 30 via the discharge pipe 73. A water cooling unit 31 is attached to the discharge pipe 73 at substantially the center thereof. A cooling water pipe 31A is attached to the cooling unit 31 wherein water introduced from the outside of the sulfuric acid recycle apparatus 1 into the cooling water pipe 31A flows inside the cooling unit 31, then it is again exhausted outside the sulfuric acid recycle apparatus An inlet pipe 30A and a deaeration pipe 30B are respectively attached to the aspirator 30 wherein dry air is taken in the aspirator 30 from the outside of the sulfuric acid recycle apparatus 1 through the inlet pipe 30A and this dry air and air inside the reaction bath 10 are respectively subjected to deaeration by the deaeration pipe 30B. The inside of the reaction bath 10 during the concentration process is kept in a prescribed decompression state by the aspirator 30.

The discharge pipe 73 has a side pipe 73A which is branched at the aspirator 30 side rather than at the cooling unit 31 side wherein the side pipe 73A extends to a trap bath 32 for storing water and the like therein. A drainpipe 74 having a second valve 92 is attached to the bottom surface of the trap bath 32, wherein water and the like stored in the trap bath 32 is exhausted outside through the drainpipe 74. Two fluid level sensors 85A are attached to the trap bath 32 whereby an opening degree of the second valve 92 is adjusted to keep the amount of fluid inside the trap bath 32 at a prescribed level.

First to third partition plates 11A, 11B, 11C respectively made of quarts glass are installed in the reaction bath 10 and directed from the introduction port 12 side to the discharge port 13 side in this order as shown in FIG. 2 so as to change an advancing direction of the wafer cleaning waste fluid A.

The first partition plate 11A is disposed inside the reaction bath 10 while it is remote from the bottom surface 10A of the reaction bath 10 at a prescribed interval. The second partition plate 11B is disposed in the reaction bath 10 without producing a gap between itself and the bottom surface 10A of the reaction bath 10. Further, the upper end position of the second partition plate 11B is set to be lower than the upper end position of the first partition plate 11A so as to prevent the wafer cleaning waste fluid A, which is moved between the first partition plate 11A and the second partition plate 11B, from flowing back. Further, the third partition plate 11C is disposed in the reaction bath 10 while it is remote from the bottom surface 10A of the reaction bath 10 at a prescribed interval in the same manner as the first partition plate 11A.

The inclination plate 16 made of quarts glass is disposed in the reaction bath 10 between the third partition plate 11C and the discharge port 13. The inclination plate 16 comprises a vertical wall 16A having saw-blade shape at the upper end and an inclination wall 16B which is integrated with the vertical wall 16A and extend from the vertical wall 16A to the discharge port 13 side to be expanded at a hem thereof. Surfaces of the vertical wall 16A and inclination wall 16B have a plurality of irregularities 16C for increasing surface areas thereof. Although the irregularities 16C are in the form of protrusion, the shape thereof are arbitrarily, and hence they are not limited to such protrusion but may be formed of any shape such as a corrugated sheet shape having a plurality of lateral grooves or a shape having a plurality of grooves in a vertical direction. Returning back to FIG. 2, the waterdrop storage bath 17 made of quarts glass is provided in the reaction bath 10 at the inner surface thereof so as to overhang from the right upper wall surface of the reaction bath 10 to cover the lower portion of the gas discharge port 14.

The first to third heaters 20A, 20B, 20C are attached to a ceiling 10C of the reaction bath 10 so as to penetrate the ceiling 10C wherein the lower ends of the first to third heaters 20A, 20B, 20C are immersed in the wafer cleaning waste fluid A. Each of the first to third heaters 20A, 20B, 20C is formed of a heater made of tungsten which is covered with quarts glass at the surface thereof.

The first heater 20A is disposed between the first partition plate 11A and the second partition plate 11B, the second heater 20B is disposed between the second partition plate 11B and the third partition plate 11C, and the third heater 20C is disposed between the third partition plate 11C and the inclination plate 16. The wafer cleaning waste fluid A which is stored in each space partitioned by the partition plates 11 and the inclination plate 16 can be heated by these first to third heaters 20A, 20B, 20C at a temperature ranging from about 180° C. to 195° C.

Two temperature sensors 80 are respectively attached between the first partition plate 11A and the first heater 20A, between the second partition plate 11B and the second heater 20B, and between the third partition plate 11C and the third heater 20C, thereby detecting temperatures of the wafer cleaning waste fluid A in each space during the concentration process thereof.

Fluid level sensors 85B are attached between the first heater 20A and the second partition plate 11B and between the third heater 20C and the inclination plate 16, whereby a degree of opening of the first valve 91 is adjusted by the fluid level sensors 85B so as to keep the amount of the wafer cleaning waste fluid A inside the reaction bath 10 at a constant level.

Now, returning back to FIG. 1, the raw material bath 40 is made of quarts glass and the waste fluid injection pipe 71 is attached to the raw material bath 40 at the portion adjacent to a lower end central portion, whereby the raw material bath 40 is connected to the reaction bath 10 via the waste fluid injection pipe 71. A raw material transportation pipe 75 made of a fluorocarbon resin and extending from the wafer processing bath 100, which is disposed outside the sulfuric acid recycle apparatus 1, is introduced in the raw material bath 40. A third valve 93 is provided on the raw material transportation pipe 75. Further, three fluid level sensors 85C are attached to the raw material bath 40 whereby a degree of opening of the third valve 93 is adjusted by the fluid level sensors 85C so as to keep the amount of wafer cleaning waste fluid A inside the raw material bath 40 at a constant level.

The concentration adjustment bath 50 is made of quarts glass and the concentrated sulfuric acid discharge pipe 72 made of a fluorocarbon resin and extending from the discharge port 13 of the reaction bath 10 is introduced in the concentration adjustment bath 50. A concentrated sulfuric acid injection pipe 76 made of fluorocarbon resin and extending to the cooling bath 60 is attached to the lower end of the concentration adjustment bath 50. A fourth valve 94 is provided at the portion adjacent to substantially central portion of the concentrated sulfuric acid injection pipe 76.

One end of a sulfuric acid injection pipe 77 for injecting fresh sulfuric acid for adjusting concentration of the concentrated sulfuric acid B is introduced in the concentration adjustment bath 50. The other end of the sulfuric acid injection pipe 77 is introduced in a sulfuric acid tank 101 installed inside the sulfuric acid recycle apparatus 1. A sulfuric acid transportation pump 77A and a fifth valve 95 are provided on the sulfuric acid injection pipe 77 at substantially central portion thereof. With the provision of these components, sulfuric acid is pumped up from the sulfuric acid tank 101 by the sulfuric acid transportation pump 77A if concentration of the concentrated sulfuric acid B obtained in the reaction bath 10 is less than a prescribed level of concentration, and pumped up sulfuric acid is injected into the concentration adjustment bath 50 through the sulfuric acid injection pipe 77 so as to increase concentration of the concentrated sulfuric acid B to a prescribed level.

Two fluid level sensors 85D are also attached to the concentration adjustment bath 50 whereby degrees of openings of the first valve 91 and fifth valve 95 are adjusted so as to keep the amount of concentrated sulfuric acid B inside the concentration adjustment bath 50 at a prescribed level.

The cooling bath 60 is made of quarts glass and the concentrated sulfuric acid injection pipe 76 is introduced in the cooling bath 60 and a sulfuric acid transportation pipe 78 made of fluorocarbon resin and extending to the wafer processing bath 100 is attached to the lower end central portion of the reaction bath 10. The pump 70 serving as a supply unit is attached to the sulfuric acid transportation pipe 78, and a sixth valve 96 is attached between the pump 70 and wafer processing bath 100. Three fluid level sensors 85E are attached to the cooling bath 60 wherein a degree of opening of the fourth valve 94 is adjusted by the fluid level sensors 85E so as to keep the amount of the concentrated sulfuric acid B inside the cooling bath 60 at substantially constant level.

The concentrated sulfuric acid B stored in the cooling bath 60 is cooled at a temperature to an extent not to exert a bad influence upon the pump 70, then it is supplied to the wafer processing bath 100 by the pump 70 through the sulfuric acid transportation pipe 78.

Gas exhaust lines 79 are attached to the raw material bath 40, the concentration adjustment bath 50, the cooling bath 60 so as to exhaust a gas such as vapor produced in the raw material bath 40, the concentration adjustment bath 50 and the cooling bath 60 to the outside of the sulfuric acid recycle apparatus 1.

Sulfuric acid is recycled as follows by use of the sulfuric acid recycle apparatus 1 having the foregoing construction.

The wafer processing bath 100 is first connected to the sulfuric acid recycle apparatus 1, and the connection therebetween is implemented by the raw material transportation pipe 75 wherein one end of the raw material transportation pipe 75 is connected to the wafer processing bath 100 and the other end of the raw material transportation pipe 75 is introduced in the raw material bath 40. The raw material transportation pipe 75 has a filter 75A provided appropriately at the wafer processing bath 100 side. A wafer cleaning fluid C prepared by mixing sulfuric acid with hydrogen peroxide solution in the wafer processing bath 100 in the proportions of 85:15 in percent by weights, and the wafer cleaning fluid C is heated at a temperature of about 145° C. so as to effect wafer cleaning process.

The wafer cleaning waste fluid A which is lowered in concentration of sulfuric acid upon completion of the wafer cleaning process is supplied to the raw material bath 40 by a raw material transportation pump 75B at a prescribed speed. At this time, the three fluid level sensors 85C provided in the raw material bath 40 detect the fluid surface level inside the raw material bath 40, thereby adjusting a degree of opening of the third valve 93 so as to keep the amount of the wafer cleaning waste fluid A at a prescribed level.

The wafer cleaning waste fluid A once stored in the raw material bath 40 is injected in the reaction bath 10 at a prescribed speed. The three fluid level sensors 85B detect the fluid surface level inside the reaction bath 10 so as to keep the amount of wafer cleaning waste fluid A inside the reaction bath 10 at a constant level while a degree of opening of the first valve 91 is adjusted in response to the detected fluid surface level.

The wafer cleaning waste fluid A injected in the reaction bath 10 is first moved from the gap defined between the lower end of the first partition plate 11A and the bottom surface 10A of the reaction bath 10 to a space defined between the first partition plate 11A and the second partition plate 11B. The wafer cleaning waste fluid A is gradually heated by the first heater 20A which is heated at the temperature ranging from 180° C. to 195° C. and water and the like contained inside the wafer cleaning waste fluid A begins to be removed. Subsequently, the heated wafer cleaning waste fluid A is circulated upward by convection from the bottom surface 10A of the reaction bath 10, and it is moved from the upper end portion of the second partition plate 11B to a space between the second partition plate 11B and the third partition plate 11C. In the same manner, the wafer cleaning waste fluid A is further heated by the second heater 20B which is heated at the temperature ranging from 180° C. to 195° C. so that concentration of sulfuric acid progresses.

The wafer cleaning waste fluid A having sulfuric acid concentration of which progresses by phased heating is circulated by convection from the upper end side of the second partition plate 11B to the side of the bottom surface 10A side, and it is moved from the gap defined between the lower end of the third partition plate 11C and the bottom surface 10A of the reaction bath 10 to a space between the third partition plate 11C and the inclination plate 16. Likewise, the wafer cleaning waste fluid A remains further heated by the third heater 20C which is heated at the temperature ranging from 180° C. to 195° C. so that concentration of sulfuric acid progresses. The wafer cleaning waste fluid A which progresses in concentration is circulated upward again by convection from the side of the bottom surface 10A side to the upper portion thereof, and it flows from the upper end portion of the inclination plate 16 having a saw-blade shape over the irregularities 16C formed on the surface of the inclination plate 16, so that it finally becomes the concentrated sulfuric acid B which is concentrated to concentration of about 95%. The thus prepared concentrated sulfuric acid B is supplied from the discharge port 13 of the reaction bath 10 to the concentration adjustment bath 50 through the concentrated sulfuric acid discharge pipe 72.

The inside of the reaction bath 10 is kept in a prescribed decompression state by the aspirator 30 connected to the gas discharge port 14 of the reaction bath 10 during the concentration process. Water vapor and the like produced by heating are sucked by the aspirator 30 into the discharge pipe 73, and they are cooled and liquefied by the cooling unit 31, then they are stored in the trap bath 32 through the side pipe 73A. Water and the like which are stored in the trap bath 32 by not less than a prescribed amount are discharged outside the sulfuric acid recycle apparatus 1 through the drainpipe 74. Water and the like which are not sucked until they reach the trap bath 32 and are liquefied at the portion close to the gas discharge port 14 lower along the inner wall surface of the reaction bath 10, and they are collected by the waterdrop storage bath 17. Further, a temperature of the wafer cleaning waste fluid A is continuously detected by the temperature sensors 80 attached to the reaction bath 10 during the concentration process. Further, an element provided in the wafer cleaning waste fluid A inside the reaction bath 10, not shown, bubbles a nitrogen gas by a prescribed amount to positively expel water vapor in the wafer cleaning waste fluid A.

The concentrated sulfuric acid B supplied to the concentration adjustment bath 50 is adjusted in concentration by supplying fresh sulfuric acid. That is, fresh sulfuric acid is pumped up from the sulfuric acid tank 101 and it is injected inside the concentration adjustment bath 50 through the sulfuric acid injection pipe 77 to be mixed with the concentrated sulfuric acid B, thereby adjusting concentration of the mixture. At this time, a degree of opening of the fifth valve 95 is adjusted so that the amount of all fluids inside the concentration adjustment bath 50 is kept at a prescribed level by the two fluid level sensors 85D. In the concentration adjustment bath 50, concentration of the concentrated sulfuric acid B is adjusted to a degree of about 95%.

The concentrated sulfuric acid B which is adjusted at a prescribed concentration in the concentration adjustment bath 50 is subsequently supplied to the cooling bath 60 through the concentrated sulfuric acid injection pipe 76 where it is cooled at a temperature of about 80° C. At this time, a degree of opening of the fourth valve 94 is adjusted so that the amount of concentrated sulfuric acid B inside the cooling bath 60 is kept at a prescribed level by the three fluid level sensors 85E provided inside the cooling bath 60. The concentrated sulfuric acid B cooled in the cooling bath 60 is supplied to the wafer processing bath 100 by the pump 70 through the sulfuric acid transportation pipe 78, and it is mixed with hydrogen peroxide solution, and is regenerated as the wafer cleaning fluid C.

There are following effects achieved by the first embodiment of the invention.

(1) The sulfuric acid recycle apparatus 1 has the reaction bath 10 for concentrating sulfuric acid in the wafer cleaning waste fluid A, and the pump 70 for supplying thus obtained concentrated sulfuric acid B to the wafer processing bath 100. Accordingly, water contained in the wafer cleaning waste fluid A and hydrogen peroxide solution can be removed, and the thus obtained concentrated sulfuric acid B can be supplied to the wafer processing bath 100 which can be again utilized for cleaning the wafer. Further, the cleaning of the wafer, concentration of sulfuric acid in the wafer cleaning waste fluid A and the recycle of the concentrated sulfuric acid B can be effected continuously, which is very efficient. As a result, a cost involved in the wafer cleaning process can be reduced.

(2) Since (the reaction bath 10) has first to third heaters 20A, 20B, 20C for heating the wafer cleaning waste fluid A, water and the like contained in the wafer cleaning waste fluid A can be evaporated by heating so as to be removed, thereby effecting a concentration operation quickly (3) The concentration process is applied to the wafer cleaning waste fluid A which is introduced from the introduction port 12 while the wafer cleaning waste fluid A is circulated vertically by convection between the partition plates 11 and the inclination plate 16. Accordingly, it is possible to heat the wafer cleaning waste fluid A steadily, thereby sufficiently concentrating sulfuric acid, and hence the concentrated sulfuric acid B having high concentration can be obtained.

(4) Since the inclination plate 16 is provided in the reaction bath 10 and the concentrated sulfuric acid B flows along the surface of the inclination plate 16 to drop in the reaction bath 10, a surface area of the concentrated sulfuric acid B becomes large when the concentrated sulfuric acid B is supplied to the discharge port 13 so that the removal of water and the like which are slightly residual in the concentrated sulfuric acid B is further accelerated, thereby improving a quality of the concentrated sulfuric acid B.

(5) Since the irregularities 16C are formed on the inclination plate 16, the surface area of the concentrated sulfuric acid B becomes larger, thereby efficiently removing water and the like contained in the concentrated sulfuric acid B.

(6) Since the waterdrop storage bath 17 is provided in the reaction bath 10, it is possible to prevent concentration of the concentrated sulfuric acid B from lowering or a quality of the concentrated sulfuric acid B from deteriorating when water and the like which are once removed from the wafer cleaning waste fluid A are mixed again with the concentrated sulfuric acid B.

(7) The concentration adjustment bath 50, the sulfuric acid tank 101 and the sulfuric acid transportation pump 77A are provided to form a unit for effecting supply of fresh sulfuric acid to adjust concentration of sulfuric acid. Accordingly, if concentration of the concentrated sulfuric acid B obtained in the reaction bath 10 is lower than a desired level, it can be adjusted in the sulfuric acid recycle apparatus 1 with ease, which is very efficient. Even if the sulfuric acid recycle apparatus 1 having the foregoing construction is used, the amount of use of fresh sulfuric acid can be remarkably reduced compared with a case where all wafer cleaning waste fluids A are wasted.

(8) Since the cooling bath 60 is provided, the concentrated sulfuric acid B can be transported to the wafer processing bath 100 after the concentrated sulfuric acid B having a high temperature is cooled to a prescribed temperature upon completion of the concentration process, and hence a bad influence is not exerted upon the pump 70 and the like.

(9) Since the amount of fluids inside the reaction bath 10, the raw material bath 40, the concentration adjustment bath 50 and the cooling bath 60 are controlled by a plurality of fluid level sensors 85B, 85C, 85D, 85E, it is possible to sufficiently effect the concentration process at a prescribed speed, and also possible to prevent the wafer cleaning waste fluid A and the concentrated sulfuric acid B from overflowing the reaction bath 10, the raw material bath 40, the concentration adjustment bath 50 and the cooling bath 60.

(10) Since three heating units comprised of first to third heaters 20A, 20B, 20C are provided in the reaction bath 10 to heat respective spaces partitioned by the partition plates 11 individually, the wafer cleaning waste fluid A can be efficiently heated. As a result, the concentration process can be effected quickly.

(11) Since a plurality of temperature sensors 80 are provided in the reaction bath 10, it is possible to avoid a problem that sulfuric acid is decomposed by abnormal heating of the wafer cleaning waste fluid A or the reaction bath 10 is corroded.

(12) Since the bottom surface 10A and the side surface 10B of the reaction bath 10 are covered with the keep-warm member 18, the temperature inside the reaction bath 10 can be kept at a prescribed level with ease owing to a heat insulation effect of the keep-warm member 18. Further, it is possible to prevent heat from transmitting to peripheral members of the reaction bath 10 by the keep-warm member 18.

Second Embodiment

A sulfuric acid recycle apparatus according to a second embodiment of the invention is described with reference to FIGS. 4 to 6. In the second embodiment, components which are the same as those of the first embodiment of the invention are depicted by the same reference numerals, and the explanation thereof is omitted or summarized.

Figure 4:
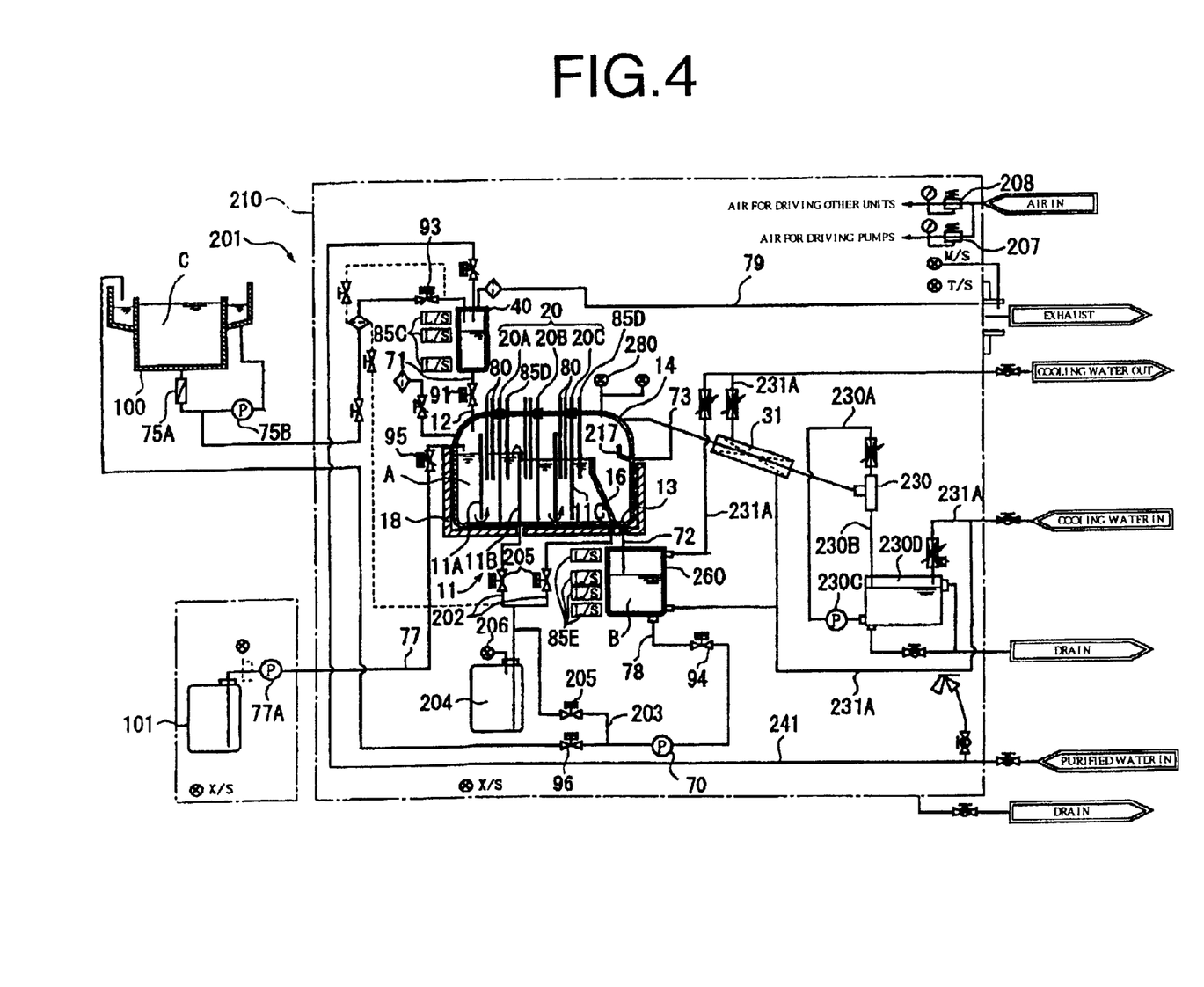
FIG. 4 is a schematic view showing the construction of a sulfuric acid recycle apparatus according to a second embodiment of the invention.

FIG. 4 is a schematic view showing the construction of a sulfuric acid recycle apparatus 201 according to the second embodiment of the invention.

The sulfuric acid recycle apparatus 201 comprises a reaction bath 10 having an inner capacity of 5 liters, first to third heaters 20A, 20B, 20C attached to the reaction bath hand shaft 10 serving as heating units, an aspirator 230 serving as a suction unit, a raw material bath 40 having an inner capacity of 2 liters, a cooling bath 260 having an inner capacity of 5 liters and a pump 70 as its main components.

A waste fluid injection pipe 71 made of fluorocarbon resin and having a first valve 91 is attached to an introduction port 12 of the reaction bath 10, and a wafer cleaning waste fluid A is introduced from the raw material bath 40 to the reaction bath 10 via the waste fluid injection pipe 71. In a state where the first valve 91 is opened, the wafer cleaning waste fluid A flows into the reaction bath 10 automatically. A concentrated sulfuric acid discharge pipe 72 for supplying concentrated sulfuric acid B to a concentration adjustment bath 250 is attached to the discharge port 13 of the reaction bath 10.

The reaction bath 10 is connected to the aspirator 230 via a discharge pipe 73. A water cooled cooling unit 31 is attached to the discharge pipe 73 at substantially the center thereof. A cooling water pipe 231A is attached to the cooling unit 31 wherein water introduced from the outside of the sulfuric acid recycle apparatus 1 into the cooling water pipe 231A flows inside the cooling unit 31, then it is again exhausted outside the sulfuric acid recycle apparatus 1.

A suction pipe 230A and a drainpipe 230B are respectively attached to the aspirator 230 wherein when a suction pump 230C provided in the suction pipe 230A is operated, water stored in a water tank 230D passes through the aspirator 230. Air inside of the reaction bath 10 is sucked by the aspirator 230 during the concentration process, and it is kept in a prescribed decompression state.

Although air sucked from the reaction bath 10 is mixed with a small quantity of sulfuric acid, this sulfuric acid is mixed with water which flows through the aspirator 230 and the drainpipe 230B, and stored in the water tank 230D. The cooling water pipe 231A is connected to the water tank 230D.

First to third partition plates 11A, 11B, 11C respectively made of quarts glass are installed in the reaction bath 10 and directed from an introduction port 12 side to a discharge port 13 side in this order in the same manner as the first embodiment so as to change an advancing direction of the wafer cleaning waste fluid A.

An inclination plate 16 having the same construction as that of the first embodiment is disposed between the third partition plate 11C and the discharge port 13.

A waterdrop storage bath 217 made of quarts glass is provided on the inner surface of the reaction bath 10 so as to protrude from a wall surface of the reaction bath 10. The waterdrop storage bath 217 is continuously formed on the horizontal surface along the circumferential direction of the inner wall of the reaction bath 10.

The first to third heaters 20A, 20B, 20C are attached to a ceiling 10C of to the reaction bath 10 so as to penetrate the ceiling 10C wherein the lower ends of the first to third heaters 20A, 20B, 20C are immersed in the wafer cleaning waste fluid A. Although these heaters 20 have the same construction as those of the first embodiment, the wafer cleaning waste fluid A in respective spaces formed by defining respective partition plates 11 and the inclination plate 16 is heated at a temperature ranging from 150° C. to 315° C., preferably from 180° C. to 250° C.

A plurality of temperature sensors 80 and fluid level sensors 85B are attached to the upper portion of the reaction bath 10 in the same manner as the first embodiment, and an exhaust pressure gauge 280 is also attached to the upper portion of the reaction bath 10.

Although a raw material bath 40 has the same construction as the first embodiment, purified water (DIW) is introduced in the raw material bath 40 through a supply pipe 241. Purified water is used for all the lines through which the wafer cleaning waste fluid A and the concentrated sulfuric acid B flows.

The concentrated sulfuric acid discharge pipe 72 is introduced in the cooling bath 260, and a sulfuric acid transportation pipe 78 is attached to the lower end of the cooling bath 260. The pump 70 is attached to the sulfuric acid transportation pipe 78 and a sixth valve 96 is attached between the pump 70 and a wafer processing bath 100. With the operation of the pump 70, concentrated sulfuric acid inside the concentration adjustment bath 250 flows through the sulfuric acid transportation pipe 78 and it is supplied to the wafer processing bath 100.

A plurality of fluid level sensors 85E are attached to the cooling bath 260 wherein a degree of opening of a fourth valve 94 is adjusted by these three fluid level sensors 85E so as to keep the amount of the concentrated sulfuric acid B inside the cooling bath 260 at substantially a constant level.

Figure 5:
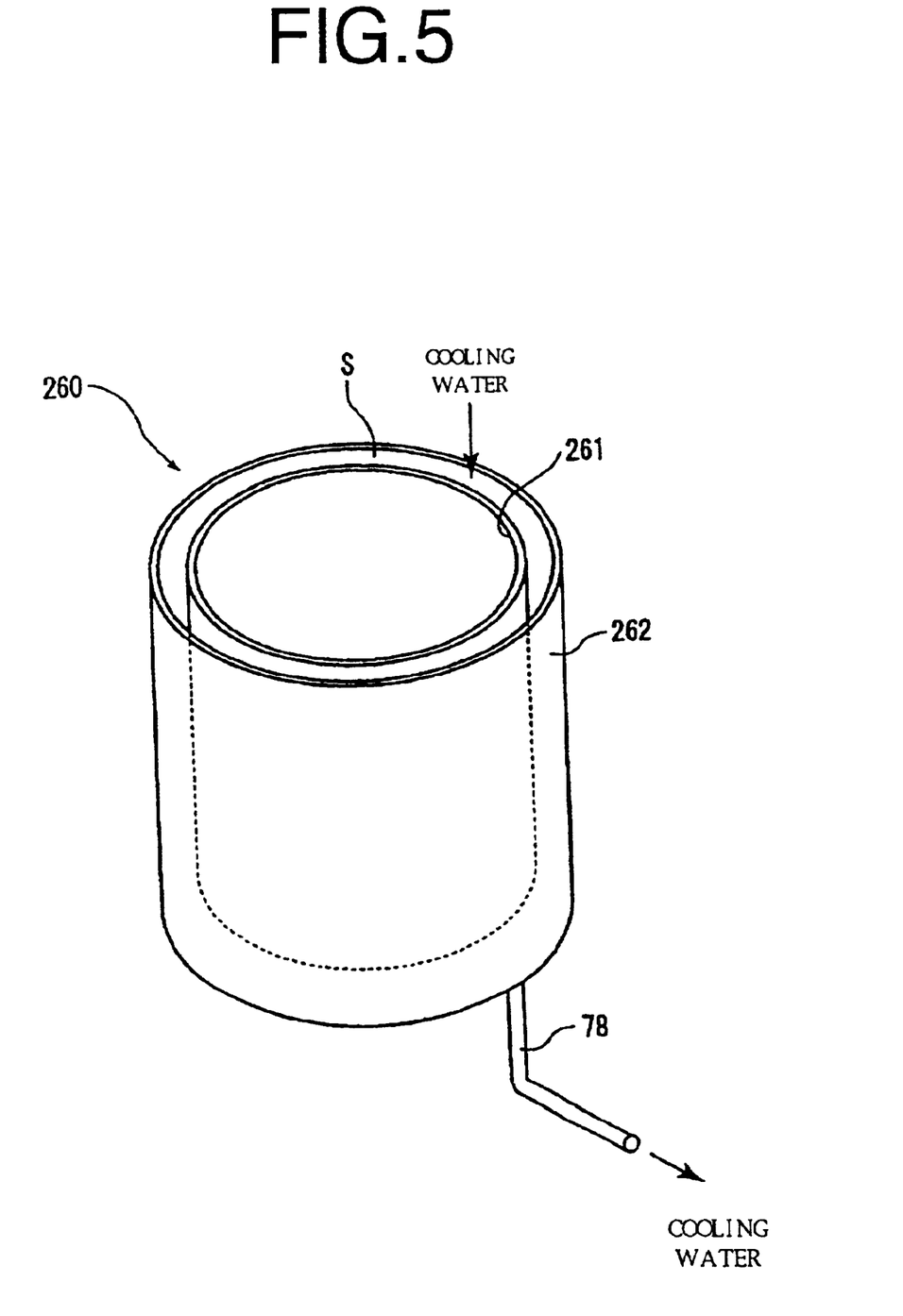
FIG. 5 is a perspective view showing a cooling bath according to the second embodiment of the invention shown in FIG. 4 wherein a part of the cooling bath is broken.

A schematic construction of the cooling bath 260 is illustrated in FIG. 5.

In FIG. 5, the cooling bath 260 comprises an inner side sealed container 261 and an external sealed container 262 respectively made of quarts glass. A prescribes space S is defined between these containers 261, 262, wherein when cooled water flows in the space S via a cooing water pipe 231A so that concentrated sulfuric acid having high temperature and stored inside the inner side container 261 is cooled.

Returning back to FIG. 4, one end of a sulfuric acid injection pipe 77 for injecting fresh sulfuric acid for adjusting concentration of the concentrated sulfuric acid B is introduced in the reaction bath 10. The other end of the sulfuric acid injection pipe 77 is introduced in a sulfuric acid tank 101 disposed inside the sulfuric acid recycle apparatus 201. A sulfuric acid transportation pump 77A and a fifth valve 95 are provided on the sulfuric acid injection pipe 77 at substantially central portion thereof. With the provision of these components, sulfuric acid is pumped up from the sulfuric acid tank 101 by the sulfuric acid transportation pump 77A if concentration of the concentrated sulfuric acid B obtained in the reaction bath 10 is less than a prescribed level of concentration, and the thus pumped sulfuric acid is injected into the concentration adjustment bath 50 through the sulfuric acid injection pipe 77 so as to increase concentration of the concentrated sulfuric acid B to a prescribed level.

In the second embodiment, concentration of the concentrated sulfuric acid B is set principally by a heating temperature inside the reaction bath 10 and a quantity of the wafer cleaning waste fluid A supplied to the reaction bath 10 per unit of time.

Each one end of two waste fluid supply pipes 202 is connected to the bottom portion of the reaction bath 10, and a waste fluid supply pipe 203 is branched from the sulfuric acid transportation pipe 78, and the other ends of the waste fluid supply pipes 202, 203 are introduced in a waste fluid tank 204. Valves 205 are provided respectively on the waste fluid supply pipes 202, 203, and when the valves 205 are operated, concentrated sulfuric acid inside and the reaction bath 10 and the cooling bath 260 is supplied to the waste fluid tank 204 as a waste fluid. Further, a fluid level sensor 206 is provided in the waste fluid tank 204.

Gas exhaust lines 79 are attached to the raw material bath 40 so as to exhaust a gas such as water vapor produced in the raw material bath 40 to the outside the sulfuric acid recycle apparatus 201.

Pump driving air is supplied to a pump constituting the sulfuric acid recycle apparatus 201 via a valve 207, and a driving air is supplied to a valve, and other driving units via a valve 208.

According to the second embodiment, the sulfuric acid recycle apparatus 201 is contained in a casing 210.

Figures 6A, 6B:
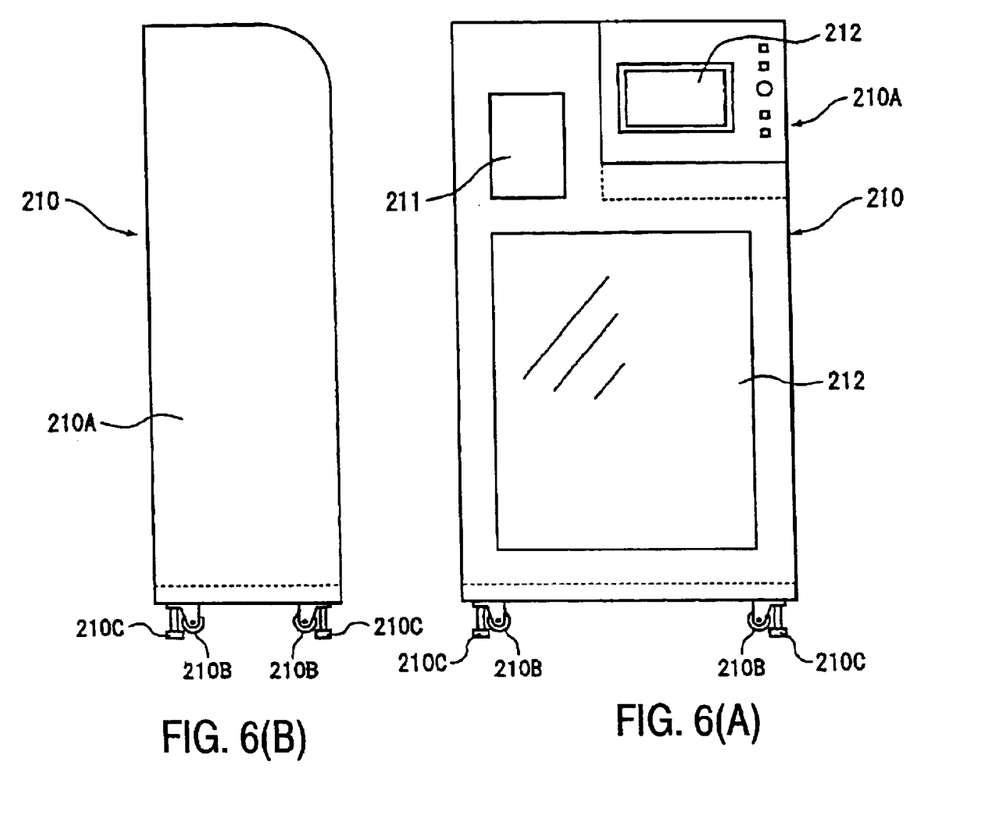

An external configuration of the casing 210 is illustrated in FIGS. 6(A) and 6(B). FIG. 6(A) is a front view of the casing 210, and FIG. 6(B) is a side view of the casing 210. In the same figures, the casing 210 is formed substantially in a box shape, and comprises a body 210A in which the reaction bath 10, the cooling bath 260 and the other constituting members are housed. Casters 210B are provided on the lower surface of the body 210A and stoppers 210C are disposed at portions close to the casters 210B. The sulfuric acid recycle apparatus 201 housed in the casing 210 can be transported to an arbitrary place by the casters 210B with ease, and it can be fixed to the arbitrary place by the stoppers 210C.

Provided in the body 210A at the front central portion and left upper portion are two windows 211 made of a translucent member such as glass so as to see the inside of the casing 210. A unit for operating the sulfuric acid recycle apparatus 201, for example, an operation panel 212 for operating valves and pumps, is provided on the right upper portion of the body 210A. A schematic view of the sulfuric acid recycle apparatus 201, an operation button, an operation switch, and operation procedures are represented on the operation panel 212.

The sulfuric acid according to the second embodiment of the invention is recycled substantially in the same manner as the first embodiment of the invention, and hence a difference therebetween is briefly and mainly described hereinafter.

Firstly, the wafer cleaning waste fluid A which is lowered in concentration of sulfuric acid and has a prescribed temperature, e.g., 150° C. upon completion of the cleaning process is supplied to the raw material bath 40 by a raw material transportation pump 75B at a prescribed speed. The wafer cleaning waste fluid A which is once stored in the raw material bath 40 is injected into the reaction bath 10 at a prescribed speed, e.g., two liters per ten minutes. Accordingly, the quantity of the wafer cleaning waste fluid A inside the reaction bath 10 is kept substantially at a constant level.

Although the wafer cleaning waste fluid A injected in the reaction bath 10 flows through a gap defined between the lower end of the first partition plate 11A and the bottom surface 10A of the reaction bath 10 to spaces between the first partition plate 11A to third partition plate 11C, it is gradually heated by the first to third heaters 20A, 20B, 20C at a temperature ranging from 150° C. to 315° C. so that water and the like contained in the wafer cleaning waste fluid A are moved to progress concentration of sulfuric acid.

The concentrated sulfuric acid B obtained in the foregoing manner is supplied to the cooling bath 260 from the discharge port 13 of the reaction bath 10 through the concentrated sulfuric acid discharge pipe 72, and it is cooled at a temperature of about 150° C. in the cooling bath 260. A degree of opening of the fourth valve 94 is adjusted so that a quantity of the concentrated sulfuric acid B inside the cooling bath 260 is kept at a prescribed level by the fluid level sensors 85E provided in the cooling bath 260. The concentrated sulfuric acid B cooled in the cooling bath 260 is supplied to the wafer processing bath 100 by the pump 70 through the sulfuric acid transportation pipe 78 and it is mixed with hydrogen peroxide solution in the wafer processing bath 100 where it is regenerated as a wafer cleaning fluid C.

According to the second embodiment having the foregoing construction, the following functions and effects can be achieved as well as those of (1) to (6), (10) to (12) of the first embodiment of the invention.

(13) Since the waterdrop storage bath 17 is provided along the circumferential surface of the inner wall of the reaction bath 10, it is possible to prevent concentration of the concentrated sulfuric acid B from lowering or a quality of the concentrated sulfuric acid B from deteriorating when water and the like which are once removed from the wafer cleaning waste fluid A are mixed again with the concentrated sulfuric acid B.

(14) Since the sulfuric acid tank 101 and the sulfuric acid transportation pump 77A are provide and fresh sulfuric acid is supplied to adjust concentration of sulfuric acid, if need be, concentration of the concentrated sulfuric acid B obtained in the reaction bath 10 can be increased with ease when it is lower than a desired value.

(15) Since the cooling bath 260 is provided, he concentrated sulfuric acid B can be transported to the wafer processing bath 100 after the concentrated sulfuric acid B having a high temperature is cooled to a prescribed temperature upon completion of the concentration process, and hence a bad influence is not exerted upon the pump 70 and the like.

(16) Since the cooling bath 260 comprises the inner side sealed container 261 and the outer side sealed container 262 and cooled water flows through the space S between these containers 261, 262, cooling effect can be enhanced by flowing fluid, and hence these container need not be cooled by a large quantity of cooled water, thereby rendering the cooling bath 260 small-sized.

(17) Since a heating temperature inside the reaction bath 10 is set at not more than 315° C., a material of parts used for the reaction bath is not limited to a high fire-resistive material, thereby preventing the unit from a large-sized and complex. Further, since a heating temperature inside the reaction bath 10 is not less than 150° C., sulfuric acid concentration efficiency (dehydration efficiency) becomes high, thereby obtaining a predetermining effect.

(18) Since the amount of fluids inside the reaction bath 10, the raw material bath 40, and the cooling bath 260 are controlled by a plurality of fluid level sensors 85C, 85D, 85E, it is possible to sufficiently effect the concentration process at a prescribed speed, and also possible to prevent the wafer cleaning waste fluid A and the concentrated sulfuric acid B from overflowing the reaction bath 10, the raw material bath 40, and the cooling bath 260.

(19) Although the aspirator 230 has a construction to suck air inside the reaction bath 10 by water which flows through the suction pipe 230A and the drainpipe 230B, even if small quantity of sulfuric acid is mixed with the sucked air, sulfuric acid is stored in water inside the water tank 230D. Accordingly, sulfuric acid is not discharged to an atmosphere, and hence it is convenient in an environmental point of view.

(20) Since the sulfuric acid recycle apparatus 201 is housed in the casing 210 having casters, the sulfuric acid recycle apparatus 201 can be transported with ease as a whole.

EXAMPLE

An example for confirming the effect of the sulfuric acid recycle apparatus according to the second embodiment of the invention is described as follows.

In this example, the inside of the reaction bath 10 having a capacity of 5.5 liters is set at a prescribed heating temperature (temperature of heaters), and test fluid of 2 liters is supplied from the raw material bath 40 having a capacity of 3 liters to the reaction bath 10 for 16 minutes. After the test fluid is heated in the reaction bath 10 for a prescribed period of time, it is supplied to the cooling bath 260 and a sample fluid of 2 liters is taken out as samples from the cooling bath 260 to a sample container. The above procedure is repeated every 20 minutes forming one cycle.

Specific gravity of sulfuric acid in the sample container is calculated on the basis of sulfuric acid having concentration of 98% and a specific gravity of 1.834. The result of the test is shown as follows.

Example 1

Test Fluid: sulfuric acid having concentration of 83.5% at a temperature of 55° C.

Heater setting temperature; 190° C.

Time reaching the setting temperature; 40 minutes;

The result is represented by Table 1

TABLE 1

| | Test Fluid | Sample 1 | Sample 2 | Sample 3 | Sample 4 | Sample 5 |
|---|---|---|---|---|---|---|
| Specific Gravity (g/cc) | 1.7359 | 1.7634 | 1.7662 | 1.7656 | 1.7653 | 1.7636 |
| Concentration (%) | 83.5 | 87.3 | 87.7 | 87.6 | 87.6 | 87.3 |

Example 2

Test Fluid: sulfuric acid having concentration of 81.7% at a temperature of 45° C.

Heater setting temperature; 190° C.

Time reaching the setting temperature; 45 minutes

The result is represented by Table 2

TABLE 2

| | Test Fluid | Sample 1 | Sample 2 | Sample 3 | Sample 4 | Sample 5 |
|---|---|---|---|---|---|---|
| Specific Gravity (g/cc) | 1.7228 | 1.755 | 1.7589 | 1.7568 | 1.7563 | 1.7556 |
| Concentration (%) | 81.7 | 86 | 86.7 | 86.4 | 86.3 | 86.2 |

Example 3

Test Fluid: sulfuric acid having concentration of 84.6% at a temperature of 55° C.

Heater setting temperature; 200° C.

Time reaching the setting temperature; 55 minutes

The result is represented by Table 3

TABLE 3

| | Test Fluid | Sample 1 | Sample 2 | Sample 3 | Sample 4 |
|---|---|---|---|---|---|
| Specific Gravity (g/cc) | 1.7439 | 1.7703 | 1.7712 | 1.7711 | 1.7706 |
| Concentration (%) | 84.6 | 88.3 | 88.4 | 88.4 | 88.3 |

Example 4

Test Fluid: sulfuric acid having concentration of 91.5% at a temperature of 120° C.

Heater setting temperature; 230° C.

Time reaching the setting temperature; 29 minutes

The result is represented by Table 4

TABLE 4

| | Test Fluid | Sample 1 | Sample 2 | Sample 3 |
|---|---|---|---|---|
| Specific Gravity (g/cc) | 1.7933 | 1.8145 | 1.816 | 1.8168 |
| Concentration (%) | 91.5 | 94.4 | 94.7 | 94.8 |

Example 5

Test Fluid: sulfuric acid having concentration of 85.2% at a temperature of 90° C.

Heater setting temperature; 230° C.

Time reaching the setting temperature; 37 minutes

The result is represented by Table 5

TABLE 5

|  | Test Fluid | Sample 1 | Sample 2 | Sample 3 |
| --- | --- | --- | --- | --- |
| Specific Gravity (g/cc) | 1.7479 | 1.7913 | 1.7924 | 1.7962 |
| Concentration (%) | 85.2 | 91.2 | 91.4 | 91.9 |

It has been found from the going examples 1 to 5 that test fluid is concentrated at the heater setting temperature (heated temperature) ranging from 190° C. to 230° C.

The invention is not limited to the first and second embodiments but it can be modified and improved within a scope to achieve the object of the invention.

For example, although the first to third partition plates 11A, 11B, 11C have been provided inside the reaction bath 10 in the first and second embodiments, the number of the partition plate 11 is not limited to three but it may be four. Further, the arrangement of each partition plate 11 is not limited to that of the first and second embodiments, but it may be constructed that the partition plates 11 which are provided between two side walls to be spaced between one side wall to another wall by a prescribed interval and arranged alternately so that wafer cleaning fluid flows in zigzag in the reaction bath 10 in horizontal direction toward the discharge port. Further, although the inclination plate 16 is provided in the reaction bath 10 but a vertical partition plate which is not inclined may be used instead of the inclination plate 16. Further, partition plates and the inclination plate may not be provided in the inclination plate 16.

In the first and second embodiments, although the heaters 20 are provided as heating units, they may not be provided. For example, heaters may be substituted with a unit for removing water and hydrogen peroxide solution when it increases in decompression. Further, although the waterdrop storage bath 17 is provided so as to cover the lower portion of the gas discharge port 14 of the reaction bath 10, it may not be provided in the reaction bath 10. Further, the position for providing the waterdrop storage bath 17 may, for example, extend on the entire periphery of the side surface of the reaction bath 10 if it covers the upper portion of the discharge port 13 and the lower portion of the gas discharge port 14. Further, the positions of the introduction port 12, the discharge port 13 and the gas discharge port 14 provided in the reaction bath 10 are not limited to those in the first and second embodiments but they may be set arbitrarily.

Although three heaters, namely, first to third heaters 20A, 20B, 20C are provided inside the reaction bath 10 in the first and second embodiments, the number of the heater is not limited to three. That is, the number of heaters is set at arbitrary number which is determined by the number of spaces which are defined by the partitioned by the partition plates, and the like. Further, the heating unit is not limited to that which is heated from the inside thereof as set forth in the first and second embodiments but heating units which can heat the reaction bath from the outside can be used. Still further, the number of each temperature sensor 80 and each fluid level sensor 85B may be set at appropriate numbers depending on the number of the reaction bath to be used.

Although the raw material bath 40 is used in the first and second embodiments, it may not be used particularly. That is, a construction wherein wafer cleaning waste fluid can be injected from the wafer processing bath directly to the reaction bath can be employed.

Still further, although adjustment of concentration of the concentrated sulfuric acid B is effected by injecting fresh sulfuric acid in the concentrated sulfuric acid B while providing the concentration adjustment bath 50 in the first and second embodiments, the concentration adjustment bath 50 may not be provided if concentrated sulfuric acid having sufficient concentration is obtained only by a concentration process in the reaction bath. Still further, although the cooling bath 60 is provided in the first and second embodiments, it may not be provided particularly.

Although quarts glass is used as a material of the reaction bath 10, the raw material bath 40, the concentration adjustment bath 50, the cooling bath 60, the cooling bath 260, the partition plates 11 and the inclination plate 16 in the first and second embodiments, other materials which are not corroded even if they contact sulfuric acid having high concentration at high temperature may be employed. Although water cooled unit is employed as the cooling unit 31 in the first and second embodiments, an air cooled type cooling unit may be employed. Still further, although the pump 70 is employed, it may not be limited but a diaphragm pump and the like may be employed.

A concrete construction, a shape and the like for carrying out the invention may be changed to other constructions which achieve the objects of the invention.

According to the invention, the sulfuric acid recycle apparatus comprises the reaction bath for concentrating sulfuric acid in the wafer cleaning waste fluid and a supply unit for supplying thus obtained concentrated sulfuric acid to the wafer processing bath. Accordingly, water in the wafer cleaning waste fluid and hydrogen peroxide solution can be concentrated and removed so that the thus obtained concentrated sulfuric acid is supplied to the wafer processing bath, which can be utilized for cleaning wafers. Further, it is possible to continuously effect cleaning of wafers, concentrating of sulfuric acid in the wafer cleaning waste fluid, and recycling of concentrated sulfuric acid, which is very efficient. As a result, a cost involved in a wafer cleaning process can be reduced.

What is claimed is:

1. A sulfuric acid recycle apparatus for recycling sulfuric acid in a wafer cleaning fluid prepared by mixing sulfuric acid and hydrogen peroxide solution comprising:

a reaction bath having two openings formed of at least an introduction port and a discharge port for obtaining concentrated sulfuric acid by concentrating sulfuric acid in the wafer cleaning waste fluid introduced from the introduction port upon completion of a wafer cleaning process, said reaction bath including therein a plurality of partition plates for changing an advancing direction of the wafer cleaning waste fluid, and an inclination plate positioned at a portion closer to the discharge port than the partition plates so that the concentrated sulfuric acid flows along a surface thereof and then discharges into the discharge port;

a wafer processing bath for processing wafers; and a supply unit for supplying the concentrated sulfuric acid to the wafer processing bath.

2. The sulfuric acid recycle apparatus according to claim 1, wherein the reaction bath includes therein heating units for heating the wafer cleaning waste fluid and a gas discharge port for discharging a gas produced from the wafer cleaning waste fluid when it is heated by the heating unit; and a suction unit for sucking the gas is connected to the gas discharge port.

3. The sulfuric acid recycle apparatus according to claim 1, wherein the inclination plate has irregularities on its surface.

4. The sulfuric acid recycle apparatus according to claim 1, wherein the reaction bath includes a waterdrop storage bath attached to a ceiling surface of the reaction bath for preventing waterdrop from being mixed with the concentrated sulfuric acid.

5. A sulfuric acid recycle apparatus recycling sulfuric acid in a wafer cleaning fluid prepared by mixing sulfuric acid and hydrogen peroxide solution comprising:

a reaction bath having two openings formed of at least an introduction port and a discharge port for obtaining concentrated sulfuric acid by concentrating sulfuric acid in the wafer cleaning waste fluid introduced from the introduction port upon completion of a wafer cleaning process, then discharging the concentrated sulfuric acid from the discharge port;

the reaction bath including a waterdrop storage bath attached to a ceiling surface of the reaction bath for preventing waterdrop from being mixed with the concentrated sulfuric acid;

a wafer processing bath for processing wafers; and a supply unit for supplying the concentrated sulfuric acid to the wafer processing bath.

6. The sulfuric acid recycle apparatus according to claim 5, wherein the reaction bath includes therein heating units for heating the wafer cleaning waste fluid and a gas discharge port for discharging a gas produced from the wafer cleaning waste fluid when it is heated by the heating unit; and a suction unit for sucking the gas is connected to the gas discharge port.

7. The sulfuric acid recycle apparatus according to claim 5, wherein the reaction bath includes therein a plurality of partition plates for changing an advancing direction of the wafer cleaning waste fluid, and an inclination plate positioned at a portion closer to the gas discharge port than the partition plates for allowing the concentrated sulfuric acid to flow along the surface thereof.

8. The sulfuric acid recycle apparatus according to claim 7, wherein the inclination plate has irregularities on its surface.

* * * * *